(12) United States Patent
Stocken et al.

(10) Patent No.: US 7,246,278 B2
(45) Date of Patent: Jul. 17, 2007

(54) APPARATUS FOR TESTING A MEMORY MODULE

(75) Inventors: Christian Stocken, München (DE); Michael Bernhard Sommer, Raubling (DE)

(73) Assignee: Infineon Technologies AG, Munich (DE)

( * ) Notice: Subject to any disclaimer, the term of this patent is extended or adjusted under 35 U.S.C. 154(b) by 281 days.

(21) Appl. No.: 10/949,935

(22) Filed: Sep. 24, 2004

(65) Prior Publication Data

US 2005/0138506 A1    Jun. 23, 2005

(30) Foreign Application Priority Data

Sep. 26, 2003 (DE) ................. 103 44 877

(51) Int. Cl.
*G11C 29/00* (2006.01)

(52) U.S. Cl. ................................... 714/718
(58) Field of Classification Search ............... None
See application file for complete search history.

(56) References Cited

U.S. PATENT DOCUMENTS

| | | | | |
|---|---|---|---|---|
| 4,845,843 A * | 7/1989 | Babcock | ............ | 29/829 |
| 5,787,270 A * | 7/1998 | Bloomer et al. | ........... | 714/8 |
| 5,852,616 A * | 12/1998 | Kubinec | ........... | 714/718 |
| 6,178,523 B1 * | 1/2001 | Klein | ........... | 714/24 |
| 6,237,117 B1 * | 5/2001 | Krishnamoorthy | ......... | 714/724 |
| 6,324,485 B1 * | 11/2001 | Ellis | ........... | 702/117 |
| 6,393,594 B1 * | 5/2002 | Anderson et al. | ........... | 714/738 |
| 6,609,222 B1 * | 8/2003 | Gupta et al. | ........... | 714/733 |
| 6,766,461 B1 * | 7/2004 | Ando | ........... | 713/323 |
| 6,775,795 B2 * | 8/2004 | Doll et al. | ........... | 714/721 |
| 2001/0054166 A1 * | 12/2001 | Fukuda | ........... | 714/733 |
| 2002/0183955 A1 * | 12/2002 | Adler | ........... | 702/117 |
| 2004/0250181 A1 * | 12/2004 | Vogt et al. | ........... | 714/718 |

FOREIGN PATENT DOCUMENTS

DE    100 07 177 C2    3/2002
DE    101 26 591 A1    12/2002

* cited by examiner

*Primary Examiner*—Guy Lamarre
*Assistant Examiner*—Steven D. Radosevich
(74) *Attorney, Agent, or Firm*—Slater & Matsil, L.L.P.

(57) ABSTRACT

An apparatus (1) for testing a memory module (2) suitable for exchanging electrical signals with a motherboard (10) contains a device (8a–8k) suitable for detecting the operating state of at least one semiconductor chip (26a–26m) of the module, which device comprises a first set of signal lines (8a–8k), a microcontroller (3) with a memory device (32) for storing the operating state, said microcontroller being electrically connected to the signal lines (8a–8k), a clock generator (5) suitable for generating an operating clock, said clock generator being electrically connected to the microcontroller (3), and a signal connection (13) suitable for communicating a signal for controlling access to the memory module (2) between the circuit board arrangement (10) and the microcontroller (3) and for communicating to the microcontroller (3) a signal for initiating a process of detecting the operating state.

22 Claims, 4 Drawing Sheets

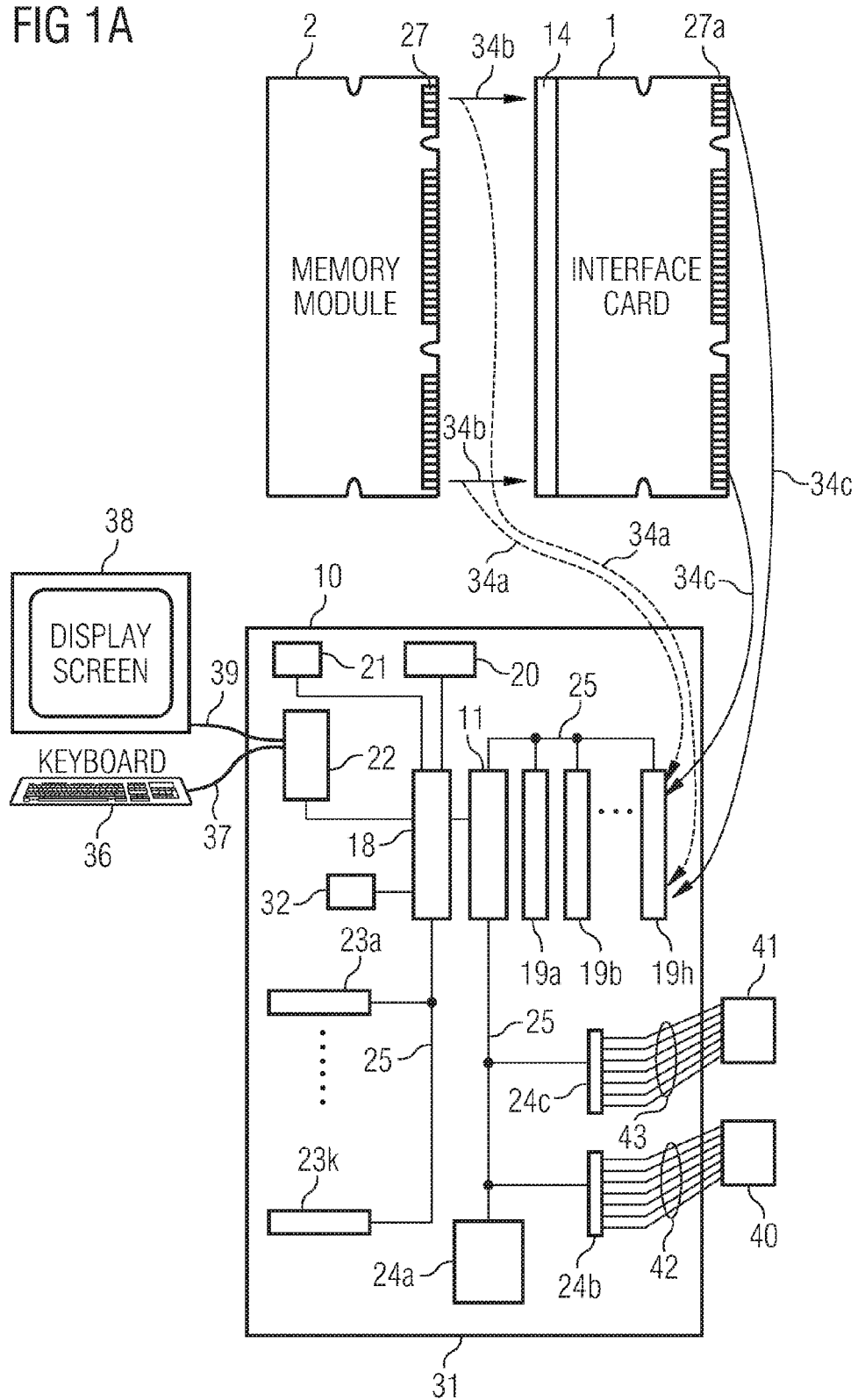

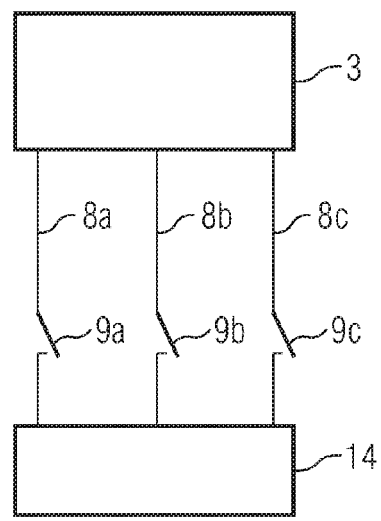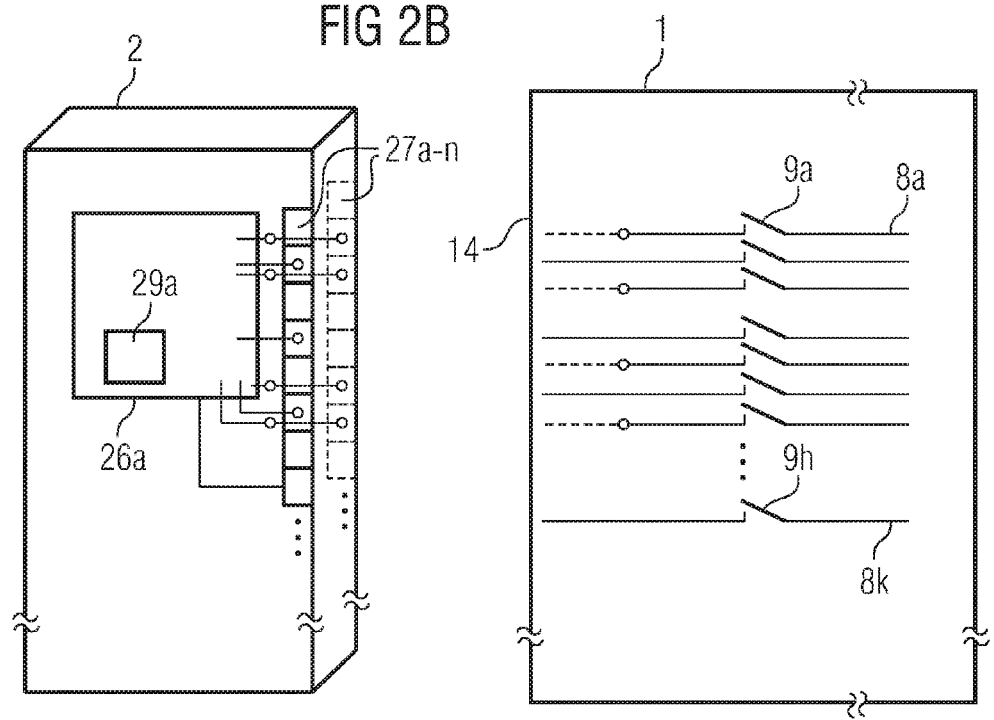

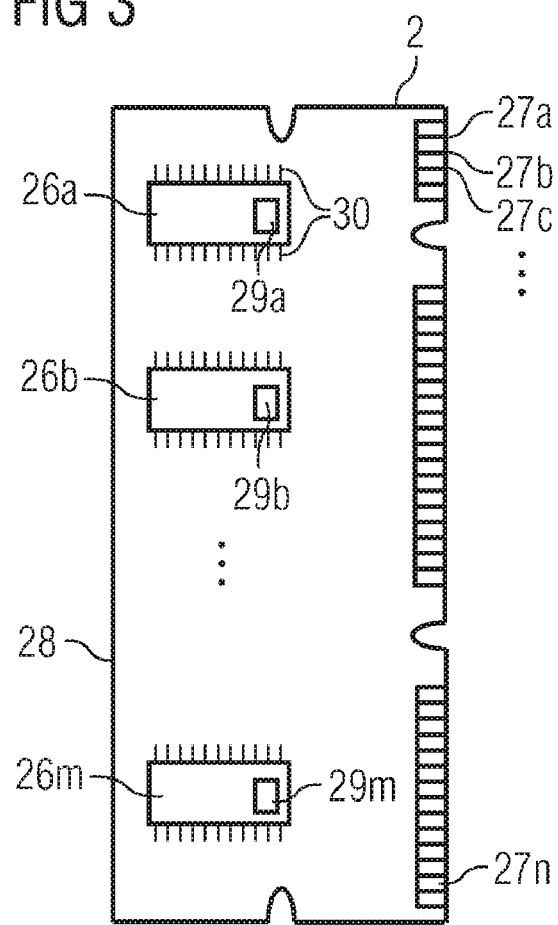

APPARATUS FOR TESTING A MEMORY MODULE

This application claims priority to German Patent Application 103 44 877.2, which was filed Sep. 26, 2003, and is incorporated herein by reference.

TECHNICAL FIELD

The present invention relates to an apparatus for testing a memory module.

BACKGROUND

Memory modules are used, for example, to provide main memory for a processor-based data processing architecture.

FIG. 3 shows a plan view of an exemplary memory module 2 that can be tested with the apparatus according to the invention. A memory module 2 of this type comprises a circuit board 28 and also at least two memory chips 26a–26m arranged thereon. A plurality of memory chips 26a–26m, for example 8, 10, 18 or 36, are usually applied on a circuit board or printed circuit board 28 of this type, it being possible for both the front side and the rear side of the circuit board to be populated. Examples of memory chips 26 comprise SDRAM or DDR SDRAM ("Double Data Rate Synchronous Dynamic Random Access"), memory chips and examples of modules comprise DIMM ("Dual Inline Memory Module") SDRAM or DIMM DDR SDRAM modules.

In the example shown, the front and rear sides of the circuit board are provided with contacts 27a to 27n at one side of the circuit board. By way of example, a total of 168 or 184 or an arbitrary number of contacts 27 may be provided via which signals are exchanged with the motherboard. The assignment as to which of the individual contacts of the memory module 2 are data, address or command lines can be gathered from the data sheets available with respect to the memory modules.

FIG. 3 also shows the electrical connections 30 associated with each memory chip and the respective mode registers 29a to 28m.

For operation, the memory module is inserted into a dedicated motherboard slot 19 and can be used as a main memory component as intended after configuration has been effected by the motherboard.

During the production of semiconductor components, such as DRAMs for example, the individual integrated circuits are usually tested while still at the wafer level by emplacement of measuring tips. The wafers are singulated into chips and the functioning chips are mounted, contact-connected and encapsulated in suitable housings. Afterward, a plurality of chips are combined to form modules by being applied on a common printed circuit board. For the functional test at the chip level, there are generally specific test circuits that are used in order to carry out the envisaged functional tests.

Particular importance is accorded to the subsequent application tests or the so-called application analysis. The interaction between the motherboard of a computer and module is examined during the application analysis. In this case, the modules in the application often behave differently than expected from the component analysis. In particular, the individual chips in the isolated state exhibit nothing conspicuous whatsoever, while the modules during the application analysis only function in certain motherboards and not in the others.

The examination of the cause of fault is problematic since generally the interaction between motherboard and module cannot be examined without intervening in the basic functions of the motherboard, whereby the measurement results are in turn corrupted.

The examination of the cause of a fault is furthermore made more difficult by the fact that, by virtue of the module being incorporated into the system, the individual subelements of the module can be accessed only with very great difficulty.

The analysis has hitherto been restricted to adjusting reference voltages on the motherboard or to adjusting the BIOS ("basic input output system"), connecting in resistances and capacitances on signal lines. Since the motherboard can only be operated in a well-defined and prescribed operating mode, however, it is not possible to carry out tests, which put the memory modules into an extreme state. By way of example, there is no known possibility of altering the timing of the chips situated on the module, of applying particularly high voltages or else, for example in the case of memory modules, of carrying out tests for determining the storage time, since the motherboard is not designed to operate with such extreme states and, therefore, does not actually permit the latter at all.

An analysis socket is commercially available which is soldered onto the motherboard and permits the module to be operated independently after the start-up of the system. Since most faults occur during the start-up of the system, the analysis socket is only of limited use. What is more, the module to be tested cannot be accessed directly from the conventional analysis socket. The module can only be accessed via the motherboard.

A further problem consists in the fact that in the booting phase, in which most application problems usually occur, a mode register set is performed by means of which the bits that specify the operating state of the individual chips are set to predetermined values. The individual chips and thus the module are thereby put into a normal application state. Accordingly, it is not possible to test a module during the start-up of the computer in a test mode. For the application engineer, however, it would precisely be of interest to put the chips into a test mode prior to the booting phase being performed, in order to examine the influence of the test modes on the booting process. This would enable application tests to be performed particularly rapidly and effectively.

SUMMARY OF THE INVENTION

In one aspect, the present invention provides an apparatus by means of which a memory module can be tested particularly efficiently and thoroughly.

According to embodiments of the present invention, an apparatus for testing a memory module has a pluggable circuit board and at least two semiconductor memory chips applied on the circuit board. The operating state of each semiconductor chip is stored on the respective semiconductor chip and the memory module is suitable for exchanging electrical signals with a circuit board arrangement with a processor-based data processing device, which comprises a processor, a memory device, a clock generator and also a signal bus and a chip set, via the signal bus and the chip set, having a device suitable for detecting the operating state of at least one semiconductor chip, which device comprises a first set of signal lines, a microcontroller with a memory device for storing the operating state, the microcontroller being electrically connected to the signal lines, a clock generator suitable for generating an operating clock, the clock generator being electrically connected to the microcontroller, and a signal connection suitable for communicating a signal for controlling access to the memory module between the circuit board arrangement and the microcontroller and for communicating to the microcontroller a signal for initiating a process of detecting the operating state.

Embodiments of the present invention thus provide an apparatus for testing a memory module by means of which the operating state of the module to be tested can be detected at any desired point in time, but in particular during the start-up of the motherboard. As a result, it is possible to check during the start-up whether the module is initialized properly or whether it is put into an undesirable operating state, for example.

Usually, the operating state of the module to be tested is stored in registers of the individual chips, for example in the mode registers of the memory chips in the case of a memory module. In order to detect the operating state, the individual register bits are read out by the microcontroller sequentially, in each case synchronously, with the system clock generated by the clock generator and are stored in an internal memory device.

By virtue of the fact that provision is additionally made of a signal connection suitable for communicating a signal for controlling access to the module between the circuit board arrangement and the microcontroller and for communicating to the microcontroller a signal for initiating a process of detecting the operating state, it is possible to detect the operating state at any desired point in time.

This signal connection, which is usually implemented as a trigger line between the microcontroller and the chip set of the motherboard, regulates whether at a specific point in time the motherboard or the device for detecting an operating state is permitted to access the module. It ensures that write/read processes from the motherboard, which are usually initiated by corresponding commands transmitted by a chip set of the motherboard, are interrupted until the operating state of the module to be tested has been detected.

An output device for outputting the operating state is preferably provided. This may be in particular a display apparatus, in particular a liquid crystal display apparatus or a screen, or, alternatively, a data line that is connected to a further memory device. Accordingly the content of the register can then be displayed on a screen or display.

According to embodiments of the present invention, it is preferred, in particular, for the apparatus according to the invention additionally to comprise a voltage supply device, which is electrically connected to the clock generator and the microcontroller and also the memory module to be tested and which is suitable for supplying the memory module with voltage, those lines of the signal bus of the circuit board arrangement which are provided for the voltage supply of the memory module not being connected to the memory module. Accordingly, those connections of the memory module which are provided for the voltage supply of the memory module are connected to the voltage supply device of the apparatus according to the invention.

This makes it possible for the module that is to be tested, to be operated and tested independently of the operation of the motherboard. Consequently, the module can be initialized and tested before the motherboard is actually switched on or started up. Before, during and after the subsequent start-up of the motherboard, the operating state of the module to be tested can then be detected and examined for irregularities.

This embodiment is advantageous in particular to the effect that because the module is operated independently of the motherboard, it is possible to create extreme testing conditions which would not be permissible during the operation with a motherboard. In particular, it is possible to set the timing of the chips situated on the module, in particular the setup and hold parameters, or, alternatively, the on-chip voltages to overvoltage or undervoltage, for example. A particularly high test depth and efficiency can thereby be achieved.

Because the application engineer now has the possibility of directly accessing the test modes, the test method can be accelerated to an extreme degree.

Furthermore, in the case of this embodiment, the mode registers of the individual chips can be put into specific test modes before the start-up of the motherboard and the influence of the test modes on the booting process of the motherboard can be examined. By way of example, bits selected in a targeted manner in the mode registers are set to specific values prior to the start-up and the way in which that affects the booting process is examined. Fault sources in the application of the memory modules can thereby be determined particularly efficiently.

The apparatus according to embodiments of the invention may furthermore comprise a memory device such as an EEPROM, for example, which is electrically connected to the microcontroller and the clock generator, for storing at least one test program suitable for the execution of functional tests of the memory module. One or a plurality of test programs may be stored in this case.

The apparatus according to embodiments of the invention may furthermore comprise an input device electrically connected to the microcontroller, for inputting a test program that can then be stored in the EEPROM, for example, and for initiating a test program. Such an input device may be a keyboard, for example. The test program may also be initiated just by changing over a switch.

Further advantages emerge if different signal lines between microcontroller and module to be tested in each case drive different semiconductor memory chips, and at least one programmable switch arranged at a signal line is provided, which is suitable for interrupting the signal line in accordance with a test program.

Since, in the case of the customary memory modules, different data lines are in each case provided for the different chips, while the command or address lines do not differ, the switches are in this case arranged at the data lines.

In the case of this preferred embodiment, it is possible to control the switches for different signal paths in such a way that only specific areas, that is to say specific memory chips, of the module to be tested are addressed by the test program. A specific area can thereby be tested in a targeted manner. Accordingly, the test can be accelerated and performed more efficiently.

In preferred embodiments, the apparatus according to the invention is preferably embodied as a pluggable circuit board with a plug connection for receiving the module to be tested, the apparatus being suitable for being plugged into the slot of the circuit board arrangement that is provided for the module to be tested and for receiving the module to be tested in the plug connection of the apparatus. For example, the apparatus according to the invention can thus be realized in particular as an interface card, which is inserted like a normal module into a socket—provided in the motherboard—for the module to be tested. A socket, into which the module to be tested can then be inserted, is in turn situated on the interface card itself. In this case, the apparatus, for the execution of the application tests, can be connected in a particularly simple manner to the motherboard and to the module to be tested. However, it is evident to the person skilled in the art that the apparatus according to the invention can also be realized differently. Thus, by way of example, at least one of the connections may be a cable connection.

Embodiments of the present invention furthermore provide an arrangement, comprising a circuit board arrangement with a processor-based data processing device, which comprises a processor, a memory device, a clock generator and also a signal bus and a chip set, an apparatus for testing a memory module as defined above, the apparatus being connected to the circuit board arrangement via the signal bus and also a signal connection, and also with a memory module connected to the apparatus via the first set of signal lines and to the circuit board arrangement via a second set of signal lines, the arrangement being suitable for performing the test programs stored in the memory device.

BRIEF DESCRIPTION OF THE DRAWINGS

The present invention will be explained in more detail below with reference to the accompanying drawings, in which:

FIG. 1A shows a schematic view of a motherboard with an apparatus according to a preferred embodiment of the invention, and with a module to be tested;

FIG. 2A shows an enlarged view of a signal path in accordance with a preferred embodiment;

FIG. 2B shows a schematic illustration of the data lines between a selected chip of the module to be tested and the apparatus according to the invention; and FIG. 3 shows a plan view of an exemplary memory module.

Figure 1B:
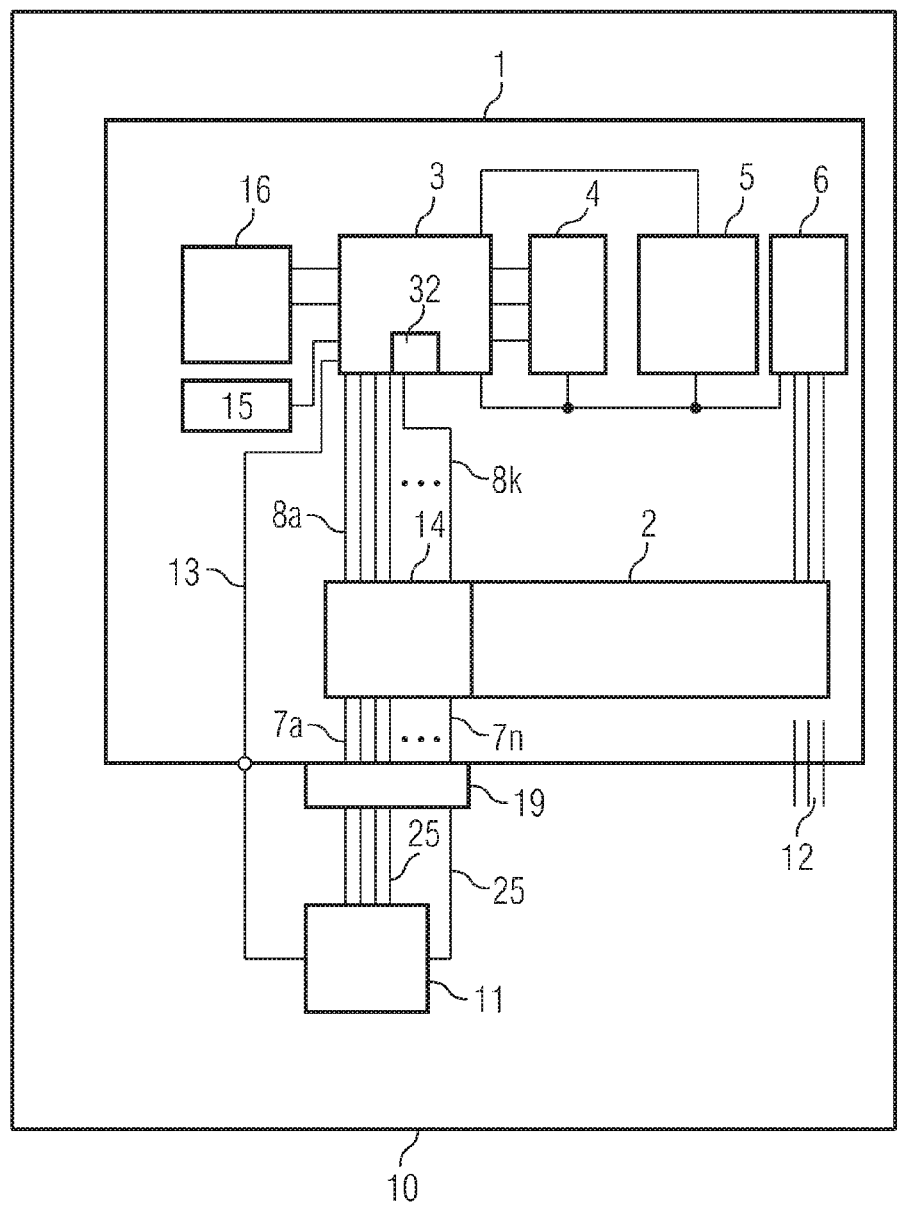
FIG. 1B shows a schematic illustration of the apparatus according to a preferred embodiment of the invention.

| | |
|---|---|
| 1 | Interface card |
| 2 | Module to be tested |
| 3 | Microcontroller of the interface card |
| 4 | EEPROM of the interface card |
| 5 | Clock generator of the interface card |
| 6 | Voltage source of the interface card |
| 7a–7n | First set of signal lines |
| 8a–8k | Second set of signal lines |
| 9a–9h | Switch |
| 10 | Motherboard |
| 11 | Chip set |
| 12 | Current line |
| 13 | Trigger line |
| 14 | Signal interface |
| 15 | Input device |
| 16 | Output device |
| 17 | Processor of the motherboard |
| 18 | Memory device (ROM) of the motherboard |
| 19a–19h | RAM slot |
| 20 | Clock generator of the motherboard |
| 21 | Voltage source of the motherboard |
| 22 | Input/output interface of the motherboard |
| 23 | Card slots |
| 24a–24c | Connections for drives |
| 25 | Signal bus |
| 26a–26m | Memory chips |
| 27a–27n | Contacts |
| 28 | Circuit board of the memory module |
| 29a–29m | Mode registers of the memory chips |
| 30 | Connections of the memory chip |
| 31 | Main circuit board of the motherboard |
| 32 | Register of the microcontroller |
| 34a | Connection for normal operation |

-continued

| | |
|---|---|
| 35b–35c | Connections for testing according to the invention |
| 36 | Keyboard |
| 37 | Wire connection between keyboard and motherboard |
| 38 | Display |
| 39 | Wire connection between display and motherboard |
| 40–41 | External connectors |
| 42–43 | Wire connections between external connectors and motherboard |

DETAILED DESCRIPTION OF ILLUSTRATIVE EMBODIMENTS

In its lower part, FIG. 1A shows a schematic view of a motherboard of a computer. The motherboard 10 is essentially a circuit board arrangement with a processor-based data processing device. The latter comprises, inter alia, a processor 17, a memory device 18, a clock generator 20 and a bus 25 for the exchange of signals among the system components. Data, addresses, operating commands and control signals are transferred via the bus. For the exchange of signals between the processor 17 and a main memory, the processor 17 drives the chip set 11, which converts the specified memory address into a memory module address and transmits corresponding commands to the corresponding memory module 2 via the data bus 25. The memory module 2 is part of the main memory of the motherboard 10. During the communication between memory module 2 and processor 17, the signals are thus exchanged between memory module 2 and chip set 11. During normal operation, memory module 2 connects directly to the motherboard 10 with a memory slot such as slot 19h as indicated by dashed lines 34a. However during testing according to this embodiment of the invention, and as is discussed hereinafter, connector 27 of memory module 2 is inserted into socket 14 as indicated by short arrow 34b of the interface card 1, which in turn is connected to the motherboard 10 at slot 19 as indicated by the solid lines and arrows 34c by inserting connector 27a into one of the slots 19a–19h.

As shown in FIG. 1A, on a circuit board 31 of the motherboard 10, there are provided the processor 17, the memory device 18 (ROM) far nonvolatile storage of the system programs, a voltage supply device 21, a clock generator 20 for generating a system clock, an interface 22 for communication with input and output devices such as, for example, a keyboard 36 with connecting line 37 and a screen 38 with connecting line 39, connections 24a, 24b, 24c for the connection of internal storage hard disks, (i.e. connector 24a) and external storage drives such as, for example, floppy disk and/or a CD drive (i,e. connector 40 connected to connection 24b by lines 42 and connector 41 connected to connection 24c by lines 43). and further card slots 23a–23k, which can be populated, as desired by the user, with cards for inputting signals externally.

The slots 19a to 19h are provided for the connection of elements of the main memory, more precisely the DRAM memory modules described above.

Signals, in particular commands, addresses and data, are exchanged between the individual components via the signal bus 25.

FIG. 1A shows an embodiment in which the testing apparatus according to the invention is realized as an interface card 1. The interface card 1 is inserted like a normal module into a socket 19 provided in the motherboard 10 for the module 2 to be tested. The module 2 to be tested is in turn inserted into a socket 14 on the interface card 1.

The constituent parts of the interface card 1 and their interaction with the motherboard are illustrated schematically in FIG. 1B, the size proportions illustrated not necessarily corresponding to the real size proportions.

All the logic required for programming the test modes is situated on the interface card 1. This includes a clock generator 5, by means of which a clock frequency corresponding to the module can be generated. Also situated there is a microcontroller 3 responsible for the execution of the corresponding initialization sequence and the initiation and control of the test mode. The microcontroller 3 usually contains a register 32 in which the detected operating state can be stored later. A memory device 4, for example an EEPROM, for storing the test mode sequence may additionally be provided.

The interface card 1 furthermore comprises a voltage source 6 provided for connection to the corresponding voltage supply lines of the module, so that the module can be supplied with operating supply voltage independently of the motherboard 10. As a result, it is possible, for example, to initialize and test the module 2 as long as the motherboard 10 itself has not yet been started up.

The interface card 1 furthermore comprises a first set of lines 7a to 7n, which exchange electrical signals between a chip set 11 of the motherboard 10 and the module 2 to be tested, and also a second set of lines 8a to 8k, which exchange electrical signals between microcontroller 3 and the module 2 to be tested. In this case, the number of lines 8a to 8k of the second set need not necessarily correspond to the number of lines 7a to 7n of the first set, but rather is chosen in accordance with the functioning of the interface card 1.

According to preferred embodiments of the present invention, it is preferred for only the lines for transferring data, addresses and commands to be routed via the interface card 1. These lines are hereafter referred to as signal lines without a distinction in accordance with the transferred information.

In accordance with the embodiment described, on the other hand, the lines for the voltage supply between motherboard 10 and module 2 to be tested are not routed through on the interface card 1, thereby ensuring an independent operation of module 2 to be tested and motherboard 10.

In the case of the interface card 1 shown, the microcontroller 3 may comprise a RISC processor ("reduced instruction set controller").

An application engineer may operate or program the microcontroller 3 via a keyboard 15, for example, and view the results called up on a display device 16, for example an LCD display.

With the interface card 1 illustrated in FIG. 1B, it is now possible to perform, inter alia, the following test methods at the module 2 to be tested.

First, the module is tested prior to the start-up of the motherboard. For this purpose, the module 2 is first of all initialized by the application of predetermined signals according to a predetermined method such as is described for example in the data sheets of the modules or the associated chips. The initialization sequence is required in order to be able to address the module 2 in a defined manner and subsequently to be able to transmit the test mode.

The test modes are then transmitted after the initialization process. In this case, the test mode sequence is generally stored in the EEPROM 4 and is read out as required by the microcontroller 3 and sent to the module 2. However, the test mode sequence may also be input directly by means of corresponding commands via the keyboard 15.

In particular, the test modes that are implemented for the component analysis may be utilized in this case. However, it is also possible to provide additional circuits at the chip level.

Examples of test modes that can be performed comprise the trimming of the on-chip voltages or the alteration of setup and hold parameters. During this module test, which is carried out independently of the motherboard, the module to be tested may, in particular, be put into extreme states that lie outside the specification for customary operation with a motherboard 10 and are therefore impermissible but, on the other hand, enable a particularly effective and time-saving testing of the module 2.

In accordance with a preferred embodiment of the invention, through incorporation of switches and corresponding programming of the microcontroller 3, it is possible to address not only the entire module 2 but just a specific area or a specific individual element of the module 2. This is illustrated in FIG. 2A.

FIG. 3 illustrates a memory module by way of example. The memory module 2 comprises a circuit board 28 on which a number of individual integrated memory chips 26a, 26b, . . . , 26m are arranged. The memory module has external connections 27a, . . . , 27n via which data, control, address signals are transferred to the memory module 2 and are distributed to the individual semiconductor chips 26a, . . . , 26m on the module 2. Each of the memory chips on the module has a mode register 29a, . . . , 29m in which the respective operating state of the memory chip can be stored.

FIG. 2A shows a schematic view of the signal lines 8a, 8b, 8c between microcontroller 3 and the second interface 14. In this case, a respective signal line 8 is provided for the individual subelements for elucidating a preferred embodiment. As shown in FIG. 2A, switches 9 may be provided which may optionally be closed or not closed depending on the programming of the microcontroller 3. As a result, it is possible that when performing the test methods described, on the one hand the entire module 2 that is to say all the individual chips situated on it, are addressed or, on the other hand, a specific chip is addressed in a targeted manner. Accordingly, the non-addressed chips remain in their normal state when a test method is performed. As a result, a suspected chip can be analyzed in a targeted manner.

FIG. 2B shows a schematic illustration of the data lines 8a to 8h between a selected chip 26a of the module 2 to be tested and the apparatus 1 according to the invention.

In FIG. 2B, the semiconductor chip 26a is organized in such a way that data are exchanged via 8 data lines. At the present time, data exchange via 4 or 16 data lines is also possible in the case of commercially available semiconductor chips. In the example shown, the 8 data lines are connected to the second, fourth, sixth and eighth contacts 27a–27n on the front side and the second, third, sixth and seventh contacts on the rear side of the circuit board. In a corresponding manner, the data lines 8a to 8h run on the interface card according to the invention such that they are connected to the associated contacts at the signal interface 14. For reasons of better clarity, the signal lines at the further contacts, which may be for example command, address or data lines for the other semiconductor chips, are not illustrated.

The data lines 8a to 8h are respectively provided with switches 9a to 9h. Since, in the case of this configuration of the semiconductor chips, all the switches associated with a chip in each case have to be changed over, a so-called 8-fold quick-switch is preferably used in the case of which all 8 switches are put into the desired state by means of a single drive command, so that all 8 lines are interrupted or switched to conduction by means of one command.

Moreover, the module test described can also be performed by means of an apparatus which has no connection whatsoever to a motherboard. More precisely, it can be performed by means of an apparatus which merely has a microcontroller, a clock generator, a voltage source and also a set of signal lines and a corresponding signal interface between the signal lines and the module to be tested and, if appropriate, an EEPROM for storing a test mode sequence.

After the module test just described, the voltage supply of the motherboard is switched on and the motherboard is started up.

A novel test method, which can be implemented with the apparatus according to the invention, relates to the detection of the operating state, that is to say the read-out of the mode register 29a to 29m in the case of a memory module. The test method can be performed at any desired point in time, that is to say in particular during the start-up of the motherboard 10 and configuration of the module 2 to be tested. This test method functions in a similar manner to chip ID reading. With this test method the application engineer can see what bits of the respective mode register 29a, . . . , 29m are set with what values. It is thus possible to identify whether, by way of example, test modes have been activated inadvertently during the start-up of the motherboard 10, as a result of which the cause of an application failure can be ascertained.

This test method must be implemented in such a way that write or read accesses from the chip set 11 of the motherboard 10 do not occur during the detection of the operating state. Since this test method ultimately results in intervention in the processes of the motherboard 10, it is expedient to initiate and control the temporal profile of the test method from the motherboard 10.

The test program implemented on the motherboard 10 prevents write/read accesses by the chip set 11 to the module to be tested and at the same time drives a trigger line 13, (shown in FIG. 1B) whereby the microcontroller 3 of the interface card 1 receives a signal that initiates the read-out process. The read-out process is generally initiated by the microcontroller 3 of the interface card 1 transmitting a mode register read-out command via a corresponding command line and setting the chip select command or commands to a value such that all the chips are addressed. The content of the mode registers is then output via the corresponding data lines. By virtue of the fact that different data lines are in each case provided for different chips in the memory modules 2 that are usually used, it is possible to assign the content of the mode registers that are read out to the individual chips.

During the read-out process, the register bits are read out by the microcontroller 3 according to generally known methods sequentially, in each case synchronously, with the system clock generated by the clock generator 5. After the process of reading out the operating state, it is the case that, either by means of a control signal transmitted by the microcontroller 3 of the interface card 1 or alternatively after a predetermined time duration, the chip set 11 is once again put into a state that permits a write/read access to the memory chip of the module that is to be tested.

The test method described may also be performed with an interface card 1 that does not have a dedicated voltage source 6. This further test method prevents jumping out from all the test modes with the performance of a mode register set command. Consequently, the module can be operated in a test mode after its initialization during the start-up of the motherboard 10. This has not been possible heretofore since, in the case of a memory module, for example, all the bits of the mode register are set to predetermined values by means of a mode register set command. More precisely, as soon as a chip identifies the mode register set command, a reset process is immediately initiated by means of which all the registers which exhibit an operating state different from the normal application state are set to "0".

This test method may be implemented at the chip for example by provision of a circuit, which suppresses such a reset signal.

As a consequence, the module can be operated in a test mode during the booting of the motherboard 10 and it is possible to prevent the bits that correspond to the test mode from being erased with the command "Mode Register Set" that is performed as standard during booting.

It is thus possible to examine, in particular, the extent to which a specific allocation of the mode register influences the motherboard booting process.

This test method must be provided with an increased safeguard such that a warm booting, for example, cannot be changed into this test method randomly. This may be ensured for example in that this method is initiated only when an order of commands that has been precisely specified beforehand has been transmitted.

This test method may in turn advantageously be operated if the switches 9a to 9h described above with reference to FIGS. 2A and 2B are provided. This is because different test modes can thereby be activated in different chips of the module prior to the start-up of the motherboard.

Using the interface card 1 described, the test methods presented above may be combined with one another as required. By way of example, firstly a module to be tested may be initialized and tested independently of the motherboard, then the motherboard is started up and the operating state of the module is detected. Subsequently, module and motherboard are disconnected again from the voltage source, or powered down. The module is then once again initialized and tested independently of the motherboard. Afterward, the motherboard is started up, the chips being operated in one or a plurality of test modes during booting. The operating state of the module is additionally detected at any desired points in time.

What is claimed is:

1. A testing apparatus for testing a memory module said memory module having a circuit board with a connector and at least two semiconductor memory chips applied on the circuit board, the operating state of each semiconductor memory chip being stored on the respective semiconductor memory chip, the memory module during normal operation, exchanging electrical signals between said semiconductor memory chips and a chip set on a circuit board arrangement via a signal bus, said circuit board arrangement including a connection for receiving said connector on such circuit board and having a processor-based data processing device, which comprises a processor, a memory device, a clock generator, said signal bus and said chip set, the testing apparatus comprising:

a device suitable for detecting the operating state of at least one of said semiconductor memory chip on said memory module, wherein the device comprises a first set of signal lines;

a microcontroller with a memory device for storing the operating state, said microcontroller being electrically connected to the first set of signal lines;

another clock generator suitable for generating an operating clock, said another clock generator being electrically connected to the microcontroller; and a signal connection suitable for communicating a signal for controlling access to the memory module between the circuit board arrangement and the microcontroller and for communicating to the microcontroller a signal for initiating a process of detecting the operating state.

2. The testing apparatus as claimed in claim 1 further comprising an output device, electrically connected to the microcontroller, for outputting the operating state.

3. The testing apparatus as claimed in claim 2 wherein the output device comprises a display.

4. The testing apparatus as claimed in claim 1 further comprising a voltage supply device, which is electrically connected to the another clock generator and the microcontroller and also connected to the memory module to be tested and which is suitable far supplying the memory module with voltage during testing of the memory module and wherein connecting lines of the signal bus of the circuit board arrangement which provide the voltage supply of the memory module during normal operations of the circuit board arrangement and the memory modules are not connected to the memory module during selected testing of said memory module by said testing apparatus.

5. The testing apparatus as claimed in claim 4 further comprising an input device, coupled to the microcontroller, for inputting and/or initiating a test program.

6. The testing apparatus as claimed in claim 4 further comprising another memory device, which is electrically connected to the microcontroller and the another clock generator and in which is stored at least one test program suitable for the execution of functional tests of the memory module.

7. The testing apparatus as claimed in claim 5 wherein different signal lines are provided in order to drive in each case different semiconductor memory chips, and at least one programmable switch coupled to one of the signal lines is provided, which can be controlled in a manner dependent on the test program in order to interrupt the signal line.

8. The testing apparatus as claimed in claim 1 wherein the apparatus is embodied as a pluggable circuit board with a plug connection for receiving the connector on the circuit board memory module to be tested, the testing apparatus further having a connector suitable for being received by the connector on the circuit board arrangement that is provided for receiving the module to be tested for normal operation.

9. An electronic system, comprising:
a circuit board arrangement with a processor-based data processing device, the circuit board arrangement comprising:
a processor attached to said circuit board arrangement;
a memory device attached to said circuit board arrangement;
a clock generator attached to said circuit board arrangement;
a signal bus attached to said circuit board arrangement;
a chip set attached to said circuit board arrangement; and
a connector slot attached to said circuit board arrangement and electrically connected to said signal bus;
a testing circuit board for testing a memory module, said testing circuit board connected to the circuit board arrangement a by said connector slot on the circuit board and being electrically connected to the circuit board arrangement via the signal bus and also a signal connection, said testing circuit board including another connector slot; and
a memory module connected to the testing circuit board via a first set of signal lines and to the circuit board arrangement via a second set of signal lines, the memory module connecting to the testing circuit board via said another connector slot;
whereby the electronic system is suitable for performing at least one test program stored in the memory device.

10. The system of claim 9 wherein the testing circuit board comprises:
a device suitable for detecting the operating state of at least one memory chip on the memory module, the device comprising a first set of signal lines;
a microcontroller with a memory device for storing an operating state of the at least one memory chip, said microcontroller being electrically coupled to the first set of signal lines;
another clock generator suitable for generating an operating clock, said clock generator being electrically connected to the microcontroller; and
a signal connection suitable for communicating a signal for controlling access to the memory module between the circuit board arrangement and the microcontroller on said testing circuit board and for communicating to the microcontroller a signal for initiating a process of detecting the operating state.

11. The system of claim 10 further comprising an output device, electrically connected to the microcontroller, for outputting the operating state.

12. The electronic system of claim 10 further comprising a voltage supply device, which is electrically connected to the another clock generator and the microcontroller on said testing circuit board and also the memory module to be tested, said voltage supply device suitable for supplying the memory module with voltage, and wherein connecting lines of the signal bus of the circuit board arrangement which provide the voltage supply of the memory module during normal operation of the circuit board arrangement and the memory module are not connected to the memory module during selected testing of said memory module with said testing circuit board.

13. The system of claim 12 further comprising an input device, coupled to the microcontroller, for inputting and/or initiating a test program.

14. The system of claim 12 further comprising a further memory device, which is electrically connected to the microcontroller and the clock generator on said testing circuit board and in which is stored at least one test program suitable for the execution of functional tests of the memory module.

15. An electronic system comprising:
a circuit board arrangement including a processor-based data processing device, the circuit board arrangement comprising a processor, a memory device, a clock generator, a signal bus, a chip set and a first connector connected to said signal bus;
a memory module comprising a circuit board having a second connector connectable to said first connector and at least two semiconductor memory chips mounted on the circuit board, the operating state of each semiconductor memory chip being stored on the respective semiconductor memory chip and the memory module for exchanging electrical signals with the circuit board arrangement via the signal bus, the chip set, and the first and second connectors; and testing apparatus connected between said circuit board arrangement and said memory module, said testing apparatus comprising:
- a device suitable for detecting the operating state of at least one of said at least two semiconductor memory chips, wherein the device comprises a first set of signal lines;
- a microcontroller with a memory device for storing the operating state, said microcontroller being electrically connected to the first set of signal lines;
- another clock generator suitable for generating an operating clock, said another clock generator being electrically connected to the microcontroller, and
- a signal connection suitable for communicating a signal for controlling access to the memory module between the circuit board arrangement and the microcontroller and for communicating to the microcontroller a signal for initiating a process of detecting the operating state of said at least one semiconductor memory chip.

16. The electronic system as claimed in claim 15 further comprising an output device, electrically connected to the microcontroller, for outputting the operating state.

17. The electronic system as claimed in claim 16 wherein the output device comprises a display.

18. The testing apparatus of said electronic system as claimed in claim 15 further comprising a voltage supply device, which is electrically connected to the another clock generator and the microcontroller and also connected to the memory module to be tested and which is suitable for supplying the memory module with voltage during testing of said memory module and wherein connecting lines of the signal bus of the circuit board arrangement which provide for the voltage supply of the memory module during normal operation are not connected to the memory module during said testing.

19. The electronic system as claimed in claim 18 further comprising an input device, coupled to the microcontroller, for inputting and/or initiating a test program.

20. The testing apparatus as claimed in claim 18 further comprising a memory device, which is electrically connected to the microcontroller and the another clock generator and in which is stored at least one test program suitable for the execution of functional tests of the memory module.

21. The testing apparatus as claimed in claim 20 wherein different signal lines are provided in order to drive in each case different semiconductor memory chips, and at least one programmable switch coupled to one of the signal lines is provided, which can be controlled in a manner dependent on the test program in order to interrupt the signal line.

22. The electronic system as claimed in claim 15 wherein the device, the microcontroller and the another clock generator are all attached to a circuit board with another first connector for receiving the second connector on the module to be tested, the testing apparatus having another second connector for connecting to said first connector of said circuit board arrangement that is provided for the module to be tested.

* * * * *

UNITED STATES PATENT AND TRADEMARK OFFICE
CERTIFICATE OF CORRECTION

PATENT NO. : 7,246,278 B2
APPLICATION NO. : 10/949935
DATED : July 17, 2007
INVENTOR(S) : Stocken et al.

It is certified that error appears in the above-identified patent and that said Letters Patent is hereby corrected as shown below:

Col. 6, line 46, delete "far" and insert --for--.
Col. 6, line 56, delete "43)." and insert --43),--.
Col. 11, line 18, delete "far" and insert --for--.
Col. 11, line 66, delete "a by" and insert --by--.

Signed and Sealed this

Second Day of October, 2007

JON W. DUDAS
*Director of the United States Patent and Trademark Office*